Oct. 16, 1962 W. G. PFANN 3,059,123

INTERNAL FIELD TRANSISTOR

Filed Oct. 28, 1954

INVENTOR
W. G. PFANN
BY
George S. Indig
ATTORNEY

United States Patent Office 3,059,123

Patented Oct. 16, 1962

3,059,123
INTERNAL FIELD TRANSISTOR

William G. Pfann, Basking Ridge, N.J., assignor to Bell Telephone Laboratories, Incorporated, New York, N.Y., a corporation of New York Filed Oct. 28, 1954, Ser. No. 465,376
3 Claims. (Cl. 307—88.5)

This application is a continuation-in-part of my copending application Serial No. 256,791, filed November 16, 1951, now United States Patent No. 2,739,088, issued March 20, 1956. This invention relates to junction transistors in which a concentration gradient in the base region produces an electrostatic field which has the effect of accelerating carriers through that region and to circuit arrangements incorporating such junction transistors.

Devices of the type herein described have a higher frequency cut-off than transistors of comparable dimensions not containing such an electrostatic field. In the conventional junction transistor, carrier concentration in the base region is essentially uniform in the direction of minority carrier flow. Transfer of minority carriers through the base region in such a structure is therefore almost completely by diffusion. If this diffusion time were identical for all minority carriers, the effect would be simply to delay the output signal with respect to the input. However, there is a certain amount of dispersion in transit time so that minority carriers corresponding to the particular part of an input signal wave do not arrive simultaneously at the collector. This dispersion results in a cancellation of some minority carriers by others, thereby resulting in a frequency response limitation. (See Bell System Technical Journal, volume 30, pages 530 through 563, July 1951.)

This limitation in frequency response of the junction transistor has presented some difficulty in the adaptation of this valuable new circuit element to circuits where its small size, cool operating conditions and low power requirements would otherwise make it very valuable. To overcome this limitation in frequency response, devices having very thin base regions have been produced. This reduction in the thickness of the base region and, therefore, in the dispersion of transit times to some extent, produces the desideratum of increasing the frequency response of the transistor.

Another physical limitation on the frequency response of the transistor is related to the cross-sectional area of the base region. The larger the area, the higher is the base resistance and the greater is the collector capacitance of the device. Both of these factors limit frequency response. Although the very narrow cross-section increases frequency cut-off, electrical and mechanical considerations impose a limitation on the improvement which may be effected by such means.

Other means for improving frequency response have been used. The tetrode transistor invented by R. L. Wallace, Jr. (see United States Reissue Patent 24,183) has resulted in a notable improvement. In the Wallace tetrode the base region is biased across its cross-section between the normal base electrode and an additional electrode, also contacting the base region, generally at the opposite surface, thereby restricting minority carrier flow to that portion of the base region adjacent the base electrode. Such an arrangement, in reducing capacitance and base resistance, $r_b$, results in a large improvement in frequency response.

Development of new methods of transistor manufacture has improved the control over the dimensions of conductivity regions. In my Patent 2,813,048, which issued November 12, 1957, there is described a method whereby very small conductivity regions may be created within a comparatively large block of semiconductor material. Since these regions may be supported by portions of the block, which, either have not been converted, or which have been converted so as to have other conductivity characteristics, the requirement that the base region be of sufficient size to be self-supporting is obviated.

The structure of the devices of the present invention may be utilized to supplant or in conjunction with the Wallace tetrode in the internal junction devices to which reference is made above. Use of the tapered base region devices herein described may result in an increase in cut-off frequency in the range of 100 or 200 percent as compared with a transistor structure of the same dimensions in which minority carrier transfer through the base region is primarily by diffusion. This same improvement will be realized where the concentration gradient herein described is incorporated into the Wallace tetrode, the internal junction device or other transistor structure now known to the art. As will be seen, the actual improvement in frequency response is dependent upon several factors including the type of semiconductive material, the slope and other characteristics of the carrier gradient and the operating temperature of the device.

In discussing the devices of this invention, terminology common in the transistor field will be used. In discussing concentrations, reference will be made to majority and minority carriers. By "carriers" is signified the free holes or electrons which are responsible for the passage of current through a semiconductor material, majority carriers being used in reference to those carriers in preponderance in the material under discussion, holes in p-type material or electrons in n-type material. By use of the terminology "minority carriers" it is intended to signify those carriers in the minority, that is, holes in n-type material or electrons in p-type material. Although in the most common type of semiconductor materials used in present day transistor structures, carrier concentration is generally due to the concentration of "significant impurity" that is, impurities which impart conductivity characteristics to extrinsic semiconductor materials, present theory ascribes semiconductive properties of certain materials to the presence of other influences, for example, lattice defects. By the use of the term "carrier" therefore, it is intended to include not only conductivity characteristics due to significant impurities, but characteristics due to any other influence which has the effect of imparting conductivity properties to semiconductor materials.

Although for the purpose of describing this invention reference will be made to n-p-n configurations wherein the p-region is utilized as the base region, it is to be understood that such structures are merely illustrative and that p-n-p structures or in fact any transistor structure involving minority carrier injection may be adapted to the purpose of this invention.

The devices of the present invention differ from those of the art in that the base region, instead of being of fairly uniform carrier concentration in the direction of current flow, is of graded or tapered carrier concentration. The majority carrier concentration in these devices decreases or tapers in the direction of the collector junction, thereby providing an electrostatic field which accelerates minority carriers flowing across the base in the direction of the collector. Graded base regions of this nature and the electrical effect of such gradients were disclosed in my copending application Serial No. 256,791, filed November 16, 1951. Such structures are depicted in FIGS. 17, 18 and 19 of that application.

Although the structures described in my copending application were produced by the process known as "remelting," other methods of producing such gradients are available to workers in the field. Methods of producing such gradients include, in addition to remelting with or without additions, the processes of zone-melting in which the rate of advance of the zone is varied, and solid state diffusion by which a donor or an acceptor or both simultaneously may be diffused into a block of semiconductive material under conditions which will result in a graded center region with characteristics suitable for the practice of this invention. Actual examples of methods whereby graded base region devices may be produced will be presented in this specification.

The teachings of my invention may be better understood by reference to the following figures in which.

Figure 1:
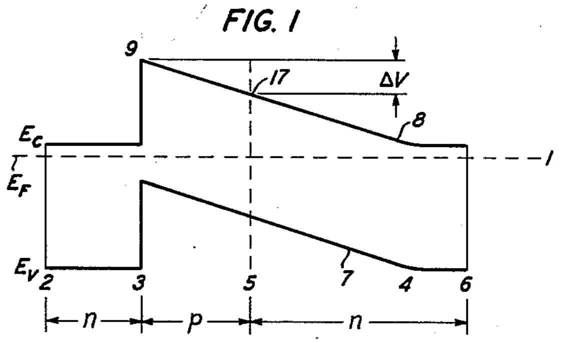
FIG. 1 is an energy level diagram of a graded base region junction device containing a graded collector junction.

Referring again to FIG. 1 the plot depicted is a conventional energy level diagram in which energy level is plotted as ordinate against distance as abscissa. Dash line 1 indicates the Fermi level, $E_F$, solid line 7 represents the top of the valence band and solid line 8 represents the bottom of the conduction band. Where the bottom of the conduction band 8 is closed to the Fermi level 1 than is the top of the filled band 7 as in regions 2—3 and 4–6, the material is n-type and where level 8 is further removed from the Fermi level than is level 7 as in region 3–5, the material is p-type. At position 3 the average energy level suddenly shifts upward thereby converting the material to p-type. Due to the sudden transition from n-type to p-type the junction at position 3 is a step junction. This junction in the device under discussion is utilized as an emitter junction. Starting at position 3 and proceeding to position 4, the average energy level is caused to decrease gradually, the transition from p-type to n-type material occurring at position 5. The region depicted by material 3–5 is graded in such manner that the carriers in the majority, that is, holes for the p-type material depicted, decrease in concentration from position 3 onward, thereby producing an electrostatic field which accelerates minority carriers in this region, that is, electrons injected from emitter region 2—3 in the direction from 3 to 5. Since the transition from p-type material to n-type material at position 5 is gradual, this junction is known as a graded junction. The graded junction at position 5 is utilized as a collector junction. The remainder of material from position 5 to position 6 is all n-type and constitutes the collector region of the device depicted.

For the purposes of this invention, the difference in energy of an electron in the bottom of the conduction band 8 at position 9, the base side of the emitter junction 3, and of an electron in the bottom of the conduction band 8 at position 17, the base side of the collector junction 5, is a critical quantity. This difference is expressed in volts in terms of $\Delta V$ as indicated.

Figure 2:
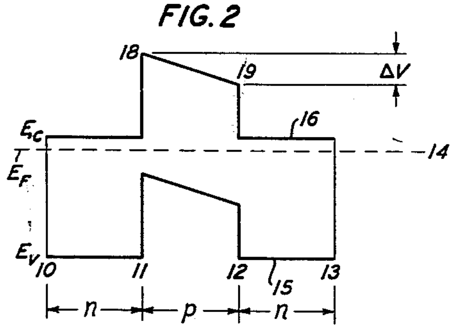
FIG. 2 is an energy level diagram of a graded base region device containing a step collector junction.

The energy diagram shown in FIG. 2 depicts an n-p-n device comprising n-region 10—11, step emitter junction 11, graded p-region 11—12 of p-type conductivity, step collector junction 12 and n-type collector region 12—13. The Fermi level is shown as dash line 14, line 16 represents the bottom of the conduction band $E_c$ and line 15 represents the top of the filled band or valence bond band $E_v$. $\Delta V$, the difference in energy in volts between an electron in the bottom of the conduction band 16 at position 18, the base side of emitter junction 11, and of an electron in the bottom of the conduction band 16 at position 19, the base side of collector junction 12 is indicated.

Figure 3:
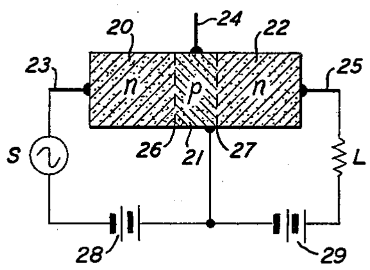
FIG. 3 is a diagrammatic view, in section, of an amplifier including a triode device containing a graded base region.

FIG. 3 is a diagrammatic view of a junction type n-p-n transistor amplifier. The structure depicted is now well known to the art and comprises n-region 20, p-region 21, n-region 22 and electrode contacts as follows; electrode 23 which functions as emitter, electrode 24, functioning as base, and electrode 25 functioning as collector. As depicted, the input circuit is connected between the emitter and base electrodes and comprises a signal source S and a voltage source 28 poled to bias the emitter junction 26 in the forward direction, and the output circuit is connected between the base and the collector electrodes and comprises the load L and the voltage source 29 poled to bias the collector junction 27 in the reverse direction. As is now well known in the art, transistor action necessarily involves a forward bias on the emitter junction and a reverse bias on the collector junction, whereby minority carriers are introduced into the base from the emitter and travel therethrough to the collector. Design criteria of such a junction device are now well known and an attempt to discuss, fully, optimum physical dimensions and types of electrode contacts will not be made. The device shown differs from devices of the art in that the majority carrier concentration in base region 21 is tapered so as to decrease from emitter junction 26 to collector junction 27. Collector junction 27 is either of the type shown in FIG. 1 in which the gradient continues right through junction 27 so that this junction is a graded collector junction, or is of the type shown in FIG. 2 in which junction 27 is a step junction. In operation, electrons emitted by emitter region 20 into base region 21 are caused to drift from junction 26 to junction 27 under the influence of the electrostatic field which is built in by reason of the concentration gradient described.

Figure 4:
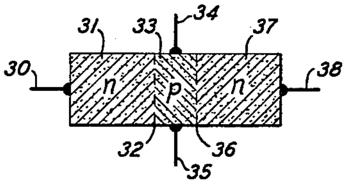
FIG. 4 is a diagrammatic view, in section, of a tetrode device containing a graded base region.

The device shown in FIG. 4 is basically a Wallace tetrode (see United States Patent 2,657,360). The device shown comprises emitter electrode 30, n-type emitter region 31, emitter junction 32, p-type base region 33, base electrode 34, tetrode electrode 35, collector junction 36, n-type collector region 37 and collector electrode 38. In operation, tetrode electrode 35 and emitter electrode 30 are biased negative with respect to base electrode 34. This arrangement has the effect of reducing the cross-section of base region 33 as seen by electrons emitted from emitter region 31 thereby reducing the positive feedback resistance $r_b$ in the base region and in this way improving the frequency response of the device. These minority carriers are collected at junction 34 in conventional manner.

The device of FIG. 4, in addition to having the electrode configuration of the Wallace tetrode, has a concentration gradient across base region 33 from emitter junction 32 to collector junction 36 which results in a gradual decrease in hole concentration thereby providing the electrostatic field which is the essence of this invention. Because of the introduction of this electrostatic field electrons are caused to drift through base region 33 thereby decreasing transit time and still further improving the frequency response of the device. The improvement which is realized in the frequency response in the tetrode for corresponding physical dimensions is the same as that realized in the triode device of FIG. 3 percentagewise.

Figure 5:
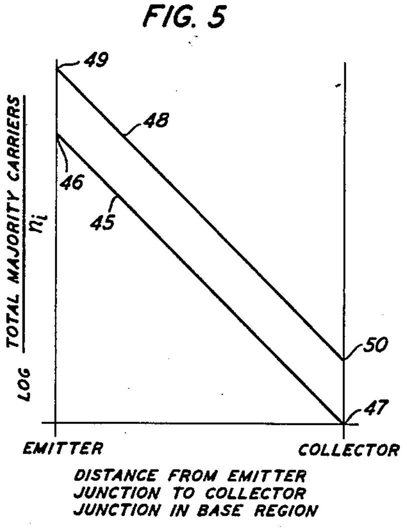
FIG. 5 is a semilog plot of total majority carriers divided by the concentration of majority carriers in intrinsic semiconductive material against distance in the base region. Curves are shown for both the graded collector junction of FIG. 1 and the step collector junction of FIG. 2.

FIG. 5 is a plot indicating desirable majority carrier concentration gradients for the devices corresponding with the energy level diagrams of FIGS. 1 and 2. In the plot shown the logarithm of the fraction of total majority carriers over $n_i$ (concentration of carriers, either holes or electrons, in intrinsic semiconductor) is plotted as ordinate against the distance from emitter junction to the collector junction in the base region. Curve 45 indicates an exponential majority carrier gradient in a graded junction device having a graded collector junction such as that corresponding with FIG. 1. It is seen that the majority carrier concentration decreases exponentially to the value $n_i$ (for which the corresponding value on the logarithmic scale is zero) which indicates a smooth transition from p-type material at position 46 (the emitter junction) to intrinsic material at collector junction 47. Curve 48 corresponds with the graded junction shown in the energy diagram of FIG. 2. The slope shown is again exponential and indicates a transition from p-type material at emitter junction 49 to p-type material containing fewer majority carriers at step collector junction 50.

For germanium, which has an intrinsic carrier concentration of about $3\times10^{13}$ carriers per cubic centimeter at room temperature, the following majority carrier concentrations, in carriers per cm.$^3$, may be inserted for illustration:

Concentration at $46=1\times10^{16}$
Concentration at $47=n_i=3\times10^{13}$
Concentration at $49=5\times10^{16}$
Concentration at $50=5\times10^{14}$ It is to be understood that the curves shown are illustrative only and represent ideal cases, and that although an exponential gradient is to be desired, any gradient which results in a decrease of majority carriers from the emitter junction to the collector junction will operate according to the teaching of this invention.

The following is a more detailed discussion of the theory applicable to and the results obtained by the use of the tapered base region devices of this invention.

In a conventional n-p-n transistor electrons emitted from the n-region at the emitter junction travel through the p-region of the base by diffusion. The transit time $\tau$ for such travel is given by the equation $$\tau=\frac{W^2}{D} \qquad (1)$$

where:

W is the thickness of the base layer in the longitudinal direction, that is, from emitter junction to collector junction for planar junctions in centimeters, and
D is the diffusivity of electrons in the semi-conductor expressed in terms of centimeters $^2$ per second.

If a uniform electrical field exists in the base layer of such direction that electrons are caused to drift toward the collector, then the transit time for electrons will be less than the value obtained from Equation 1 above because the effects of field and diffusion are added. If the field is such as to oppose diffusion, then the transit time will be greater than that obtained from Equation 1, and this results in lower cut-off frequency.

One means of producing a uniform field in the p-layer is to have the concentration of total majority carriers (holes) vary with distance through the p-layer from a high value at the emitter junction to a lower value at the collector junction. FIG. 1 indicates such a gradient in which the concentration of holes varies from some value at emitter junction 3 to a lower value at collector junction 5. Since junction 5 is graded, the material is of intrinsic conductivity at this position and therefore no excess of carriers is present. The energy diagram of FIG. 2 indicates a decreasing gradient of total majority carriers from emitter junction 11 to step collector junction 12.

For a given potential drop $\Delta V$ in the base region, the smallest average transit time occurs for a uniform electrostatic field, E, in the region. Since a uniform field is obtained by varying the majority carrier concentration exponentially, this type of variation should be approximated for best performance.

As seen from FIGS. 1 and 2 showing Fermi level, $E_F$, 1 and 14 and energy levels for the top of the valence bond band, $E_v$, 7 and 15 and for the bottom of the conduction, $E_c$, 8 and 16, a variation in the majority carrier concentration results in a variation in vertical distance between $E_F$ and $E_c$ which indicates a difference in potential, $\Delta V$. In the diagrams of FIGS. 1 and 2 an inclined energy level line indicates an electrical field for which the magnitude is indicated by the magnitude of the slope of the bottom of the conduction band line. For the diagram shown in these figures, since electrons tend to drift toward lower levels, electrons injected at the left end of the p-layer, that is, at the emitter junction, drift to the right to the collector junction due to the field.

As an illustration of the improvement in frequency response which is gained by the use of the graded p-region of this invention, there is indicated below the relationship between the magnitude of $\Delta V$, the width, W, of the base layer and the maximum operating frequency of an n-p-n tetrode transistor. Comparison is made to a tetrode in which $\Delta V$ is zero. The same relationship applies to n-p-n or p-n-p transistors operated either as triodes or as Wallace tetrodes.

It should be noted that the mathematics of the following discussion represents a somewhat simplified and, therefore, unprecise approach from a theoretical standpoint. It is believed, however, that it will be found adequate for the purpose of teaching the invention. The mathematical presentation is sufficient for any design considerations.

The tetrode on which the test runs were made had a tapered p-region of a thickness $W=0.3$ mil$=7.5\times10^{-4}$ centimeters. The device was operated as an n-p-n amplifier using first one and then the other n-region as emitter so that for one run the field aided diffusion and in the other it opposed diffusion. The maximum operating frequency F is taken either as that frequency at which the magnitude of alpha ($\alpha$) is less by three decibels than its low frequency value or that frequency at which the phase, theta ($\theta$), of alpha, is as great as 60 degrees. The decrease in magnitude of $\alpha$ is due to recombination of holes and electrons in the base layer. $\theta$ is a measure of the spread of transit times of carriers in a pulse traveling through the base. The cut-off frequency of the device therefore was considered to be the lower frequency at which either of the above conditions occurred.

In this discussion $\alpha$ is defined as the current amplification factor and $\theta$ is defined as the phase of alpha. The subscript *a* indicates that condition in which the field is aiding diffusion and the subscript *o* that in which the field is opposing diffusion. $F_a$ therefore is the frequency cut-off value with the emitter of the device such that the electrostatic field aids diffusion. $F_o$ is the frequency cut-off value for which the field opposes diffusion.

Using the above conventions the following values of cut-off frequency were measured:

$F_a=90$ megacycles
$F_o=19$ megacycles

For a phase difference $\theta=60$ degrees, the transit times, $\tau_a$ and $\tau_b$ for the device may be calculated as follows:

$$\tau_a=\frac{\theta}{369}\cdot\frac{1}{F_a}=\frac{1}{6F_a} \qquad (2)$$

$$\tau_o=\frac{\theta}{360}\cdot\frac{1}{F_o}=\frac{1}{6F_o} \qquad (3)$$

Transit time $\tau$ is related to base region thickness, W, diffusion velocity $v_d$ and drift velocity $v_f$ (where $v_d$ and $v_f$ are considered independently) for small signals:

$$\tau_a=\frac{2W}{(\sqrt{v_f^2+4v_d^2})+v_f} \qquad (4)$$

$$\tau_o=\frac{2W}{(\sqrt{v_f^2+4v_d^2})-v_f} \qquad (5)$$

Eliminating $v_d$ and solving for $v_f$ in terms of $\tau$:

$$\frac{1}{\tau_a}-\frac{1}{\tau_o}=\frac{v_f}{W}=6F_a-6F_o \qquad (6)$$

But the velocity $v_f$ due to a field E is the mobility, $\mu$, times the field. Hence:

$$v_f=\mu E=\mu\frac{\Delta V}{W} \qquad (7)$$

where:

$\mu$=mobility of injected carriers (electrons) =3600 cm.$^2$ volt$^{-1}$ sec.$^{-1}$ for germanium
$E$=electrical field in volts per centimeter Solving for the value of $\Delta V$ which has resulted in the asymmetry of transit times from Equations 6 and 7:

$$\Delta V=\frac{6W^2}{\mu}(F_a-F_o) \qquad (8)$$

=0.066 volt for the values of W, $\tau_a$, and $\tau_o$ set forth above.

The ratio of minority carrier concentrations at the emitter and collector ends of the base region may be calculated from the following equation:

$$\Delta V=\frac{kT}{q}\log_e (P_e/P_c) \qquad (9)$$

where:

$P_e$=hole concentration at emitter in carriers per cubic centimeter.
$P_c$=hole concentration at collector in carriers per cubic centimeter.

$\frac{kT}{q}$=Boltzman's constant, $k$, times absolute temperature, $T$, in degrees Kelvin divided by electronic charge, $q$=0.025 electron-volts at room temperature.

Solving for $P_e/P_c$ the value of 14/1 is obtained.

For a uniform p-layer of this thickness F is about 50 megacycles. Hence the proportionate increase in F in the field aiding instance is a factor of $$\frac{90}{50}=1.8$$

This factor is independent of thickness W for a given $\Delta V$ and, therefore, is applicable to any p-layer thickness. The absolute increase in F in megacycles, however, increases rapidly as W decreases because, in general, F increases rapidly with decrease in W. The example cited indicates an increase of 38 megacycles. This example is intended to be illustrative only and is not in any way to be construed to be a limitation on the improvement which may be realized by the use of the tapered base region of this invention.

An approximate expression for the factor R by which the cut-off frequency is increased by use of the concentration gradient of this invention may be obtained as follows from the above equations:

$$F=\frac{D}{6W^2} \qquad (10)$$

and $$F_a-F_o=\frac{\mu\Delta V}{6W^2} \qquad (11)$$

so that $$\frac{F_a-F_o}{F}=\frac{\mu\Delta V}{D} \qquad (12)$$

$$\frac{\mu}{D}=\frac{q}{kT} \qquad (13)$$

and substituting in Equation 9 above we obtain $$\frac{F_a-F_o}{F}=\log_e (P_e/P_c) \qquad (14)$$

But since F is approximately the arithmetic mean of $F_a$ and $F_o$, an approximation of the ratio $R=F_a/F$ may be obtained as follows:

$$R=1+\tfrac{1}{2}\log_e (P_e/P_c) \qquad (15)$$

As indicated above, factor R is independent of the thickness of the base region.

The maximum useful value of $\Delta V$ is equal to slightly less than half the energy gap. Energy gap is a characteristic of the particular semiconductor material and is equal to about 0.72 electron-volt for germanium and about 1.1 electron-volts for silicon. The further limit on the maximum concentration of majority carriers at the high end of the gradient is indicated by the requirement that the base material should not be permitted to degenerate to the extent that it would conduct in the manner of a metal. Further, since the value of emitter $\gamma$, defined as the fraction of the emitter current injected into the base layer over the total emitter current, is decreased as the conductivity of the base region adjacent the emitter junction is increased, a further practical maximum is indicated. Assuming the practical maximum value of emitter $\gamma$ of about 0.5 and the other considerations set forth above, a limiting value of $\Delta V$ of about 0.25 volt for germanium and about 0.35 volt for silicon is indicated.

For silicon-germanium alloys the energy gap varies from that of germanium to that of silicon as the silicon content is increased. For a 6-atomic percent silicon alloy an upper limit of about 0.3 volt is indicated.

From the above considerations a preferred $\Delta V$ range may be computed. Such a computation indicates a preferred range of $\Delta V$ for germanium of from about 0.06 volt to about 0.2 volt and for silicon of from about 0.06 volt to about 0.25 volt.

In general, if the change in energy band height in volts in the base layer is appreciably larger than $kT/q$ where $q$ is the electronic charge expressed in coulombs, $k$ is Boltzmann's constant and T is absolute temperature in degrees Kelvin, then an appreciable reduction in $\tau$ and in the spread of transit times will result.

The following are examples of methods by which semiconductive regions having majority concentration gradients suitable for use in the practice of this invention may be made. The product of each of the examples is a concentration gradient which is approximately exponential.

*Example 1.—Diffusion of Arsenic Into Germanium to Make an N-Type Base Region of Graded Conductivity*

A block of p-type germanium of initial resistivity of 25-ohm centimeters is placed in an atmosphere of arsenic vapor and is maintained for one hour at a temperature of 875° C. with only one face of the slab exposed to the atmosphere. The resultant converted region is a graded conductivity n-type region about 0.0015 inch thick in which the concentration of arsenic decreases to about 0.005 of its value at the surface. From 0.0005 to 0.0010 inch of the arsenic-rich surface is removed by etching or grinding in conventional manner. p-Type emitter contact is made to that side of the converted layer which contains the highest concentration of arsenic by alloying a button of indium by the method described by R. R. Law, C. W. Mueller, J. I. Pankove and L. D. Armstrong in Proc. Inst. Radio Engrs., volume 40, pages 1352–1357 (November 1952). The unconverted p-type region which remains at the low concentration end of the converted layer is utilized as a collector region. The device is completed by making base and collector contact in conventional manner. In the device of this example, the collector junction is graded in the manner of the energy diagram of FIG. 1.

Alternately the source of arsenic may be vapor-produced from pure arsenic at a temperature of about 300° C. the germanium slab being maintained again at a temperature of about 875° C. Such an alternate method produces a lower surface concentration of arsenic and makes unnecessary the removal of the rich layer from the surface.

*Example 2.—Remelt Process Using Germanium Alloyed with Boron and Antimony*

An example of this method of making an n-p-n transistor is given in my copending parent application, above designated, as Illustrative Calculation 3. A further example of this method is as follows:

A slice of single crystal germanium of a thickness of from about 0.050 to 0.10 inch containing a uniform concentration of antimony of $7\times10^{17}$ atoms per cubic centimeter is heated on one face and cooled on the opposite face so as to form a molten layer about 0.010 inch thick on the hot face. The molten layer is doped with about $2\times10^{15}$ atoms per cubic centimeter of boron added in the form of a germanium-boron alloy pill as described in my parent application. The molten layer is allowed to freeze in the manner described in the parent case. The resultant body contains an n-p-n barrier with a p-layer of a thickness of 0.0013 inch. The unmelted high conductivity n-region is utilized as emitter, the junction between this and the p-layer being a step junction. The majority carrier concentration of the p-region is graded from about $5\times10^{15}$ atoms per cubic centimeter at the emitter junction to intrinsic material at the collector junction. This gradient corresponds approximately to a $q\Delta V/kT$ of about 6 and, therefore, to a factor R of about 2.5. The collector junction is graded.

Electrode connection to the n-regions are made by soldering leads thereto. Base electrode contact is made by electrically bonding a pointed gold-2 percent gallium alloyed wire about 0.002 inch in diameter to the p-region.

In general, p-type base regions are to be preferred to n-type base regions since electron mobilities are usually higher than hole mobilities. Utilizing the increased mobilities of minority carrier electrons in p-type regions results in an increased frequency cut-off as compared with the lower mobilities of minority carrier holes in n-type regions. A suitable diffusion agent for converting to p-type material is indium or gallium either of which may be diffused from the vapor or from a plated or otherwise deposited coating. Such a conversion requires an exposure of approximately ten times the duration of that of Example 1, since the diffusivities of gallium and indium are less by a factor of about 100 than the diffusivity of arsenic.

What is claimed is:

1. A circuit arrangement adapted for high frequency operation comprising a junction transistor having an emitter, a base and a collector defining therebetween an emitter and a collector junction, the base being characterized by a gradient in the concentration of the predominant impurity between the emitter junction and the collector junction, said concentration being higher adjacent the emitter junction than adjacent the collector junction to provide an electrostatic field in the base, emitter, base and collector electrodes, an input circuit connected to said transistor including means for biasing the emitter junction in the forward direction, and an output circuit connected to the transistor including means for biasing the collector junction in the reverse direction.

2. A circuit arrangement in accordance with claim 1 further characterized in that the gradient in the concentration of the predominant impurity in the base of the junction transistor is approximately exponential.

3. A circuit arrangement adapted for high frequency operation comprising a junction transistor having an emitter, a base and a collector defining therebetween an emitter and a collector junction, the base being characterized by a gradient in the concentration of the predominant impurity between the emitter junction and the collector junction, said concentration being higher adjacent the emitter junction than adjacent the collector junction to provide an electrostatic field in the base, emitter, base and collector electrodes, an input circuit connected to said transistor for injecting charge carriers from the emitter into the base as a result of a forward potential difference between said emitter and base, and an output circuit connected to the transistor including means for impressing on the collector junction a potential difference in the reverse direction.

References Cited in the file of this patent

UNITED STATES PATENTS

| | | |
|---|---|---|
| 2,681,993 | Shockley | June 22, 1954 |
| 2,708,646 | North | May 17, 1955 |
| 2,730,470 | Shockley | June 10, 1956 |
| 2,793,145 | Clarke | May 21, 1957 |

OTHER REFERENCES

Letter: "The Transistor as a Reversible Amplifier," by W. G. Pfann Proc. IRE 38:1222, October 1950.